United States Patent [19]

LaFiandra Best Available Copy

[11] E Re. 30,315

[45] Reissued Jun. 24, 1980

[54] PRECISION BASE MERCURY VAPOR LAMP

[75] Inventor: Carlo F. LaFiandra, Kinnelon, N.J.

[73] Assignee: The Perkin-Elmer Corporation, Norwalk, Conn.

[21] Appl. No.: 916,278

[22] Filed: Jun. 16, 1978

Related U.S. Patent Documents

Reissue of:

[64] Patent No.: 3,878,419
Issued: Apr. 15, 1975
Appl. No.: 425,384
Filed: Dec. 17, 1973

[51] Int. Cl.[2] ..... H01J 5/50

[52] U.S. Cl. ..... 313/51; 313/49; 313/220; 362/396

[58] Field of Search ..... 313/51, 49, 220; 240/52 R; 362/396

[56] References Cited

U.S. PATENT DOCUMENTS

| | | | |
|---|---|---|---|
| 1,400,227 | 12/1921 | Minick | 362/396 |
| 2,545,884 | 3/1951 | Isaacs et al. | 176/122 |
| 2,652,483 | 9/1953 | Laidig et al. | 313/318 |
| 3,060,344 | 10/1962 | Scholes | 315/58 |
| 3,117,248 | 1/1964 | Lake | 313/220 |
| 3,156,841 | 11/1964 | Ayres | 313/51 |
| 3,267,275 | 8/1966 | Kendall et al. | 240/11.2 |
| 3,454,810 | 7/1969 | Van Cleaf | 313/214 |

*Primary Examiner*—Rudolph V. Rolinec
*Assistant Examiner*—Darwin R. Hostetter
*Attorney, Agent, or Firm*—Lyon & Lyon

[57] ABSTRACT

A mercury vapor lamp having a light transmissive envelope defining an arcuate capillary plasma cavity. A mounting base secured to one end of the envelope has a configuration which is geometrically unique with respect to the position and spatial orientation of the plasma cavity. A mounting block and clamping arrangement have a configuration complementary to that of the lamp base so as to receive and releasably secure the lamp base and, therefore, the plasma cavity in a fixed predetermined position and orientation relative to its operating environment. The lamp is energized by means of an electrical potentional applied to electrodes in the plasma cavity or by reactance coupling an r-f power source to the cavity.

7 Claims, 4 Drawing Figures

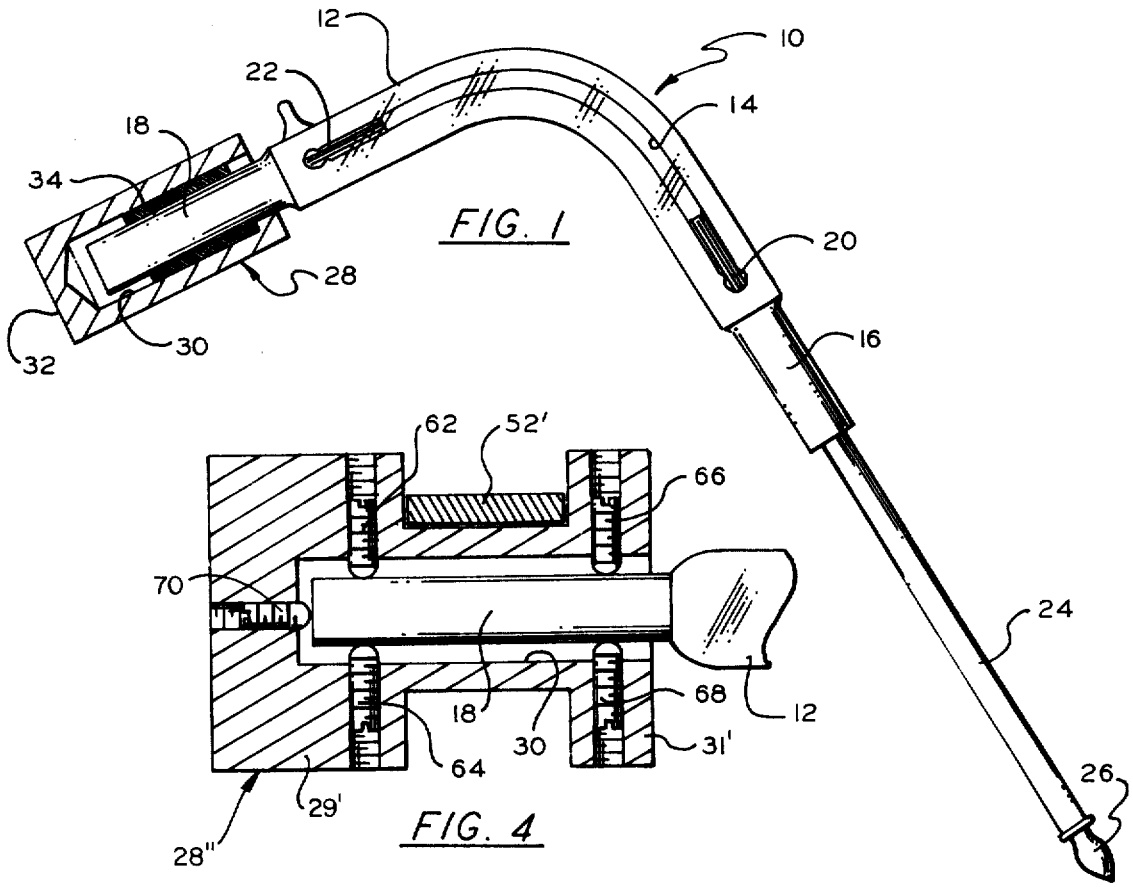
FIG. 1
FIG. 4
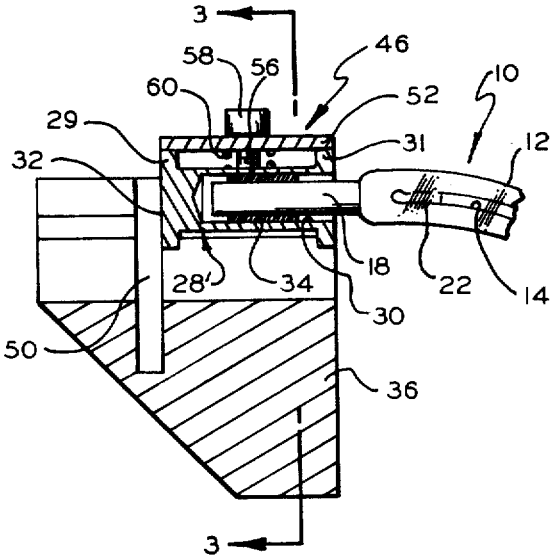
FIG. 2
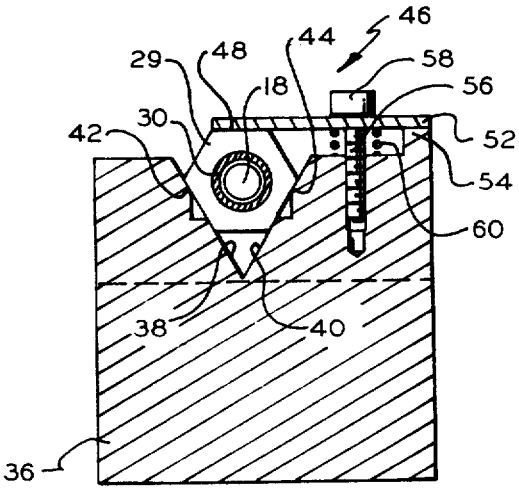
FIG. 3

PRECISION BASE MERCURY VAPOR LAMP

Matter enclosed in heavy brackets [ ] appears in the original patent but forms no part of this reissue specification; matter printed in italics indicates the additions made by reissue.

BACKGROUND OF THE INVENTION

1. Field of the Invention

This invention relates generally to gaseous discharge devices and, in particular, to gaseous discharge lamps having mounting bases.

2. Description of the Prior Art

Gaseous discharge lamps are well-known in the art and are utilized in a wide variety of applications. The particular structure and configuration of the lamps also vary with the particular use for which they are adapted but, in general, all comprise a sealed transparent or translucent envelope containing a gas or vapor and include means for energizing the lamp, exciting the gaseous substance to form a radiation-emitting plasma. The energizing means most often takes the form of a pair of spaced electrodes in the envelope to which an operating voltage is applied. However, lamps of this type are also energized by means of radio frequency electric power reactance-coupled to the lamp without the need for electrodes as such.

The present invention relates particularly to lamps of the type containing a metallic vapor, such as a mercury vapor, which may be employed in situations where the particular configuration and position of the plasma, which constitutes the light-emitting portion of the lamp when in operation, is critical and its position within its installation environment is reproducible when a lamp is replaced.

A particular requirement for such a lamp is in connection with the apparatus for the exposure of photoresist-coated wafers in the production of semiconductor devices described and claimed in a co-pending application of H. S. Hemstreet et al., Ser. No. 339,860, filed Mar. 9, 1973 and assigned to the same assignee as the present invention. This apparatus requires a mercury vapor lamp of arcuate configuration, the luminous plasma of which must be very precisely positioned with respect to its operating environment as will be described in detail hereinbelow.

It is the basic object of the invention to provide a novel gaseous discharge lamp which may be installed in its operating environment so as to position the plasma with a high degree of precision.

A further object is to provide a novel gaseous discharge lamp having a mounting base which enables the replacement of lamps in their operating environments without significant deviation in the locus of the plasma relative to such environment.

Another object is the provision of a gaseous discharge lamp fulfilling the preceding objects which is quickly and easily replaceable and which automatically positions itself so that its luminous plasma occupies essentially the exact same position occupied by it predecessor.

SUMMARY OF THE INVENTION

To the accomplishment of the foregoing and other objects, the invention contemplates a gaseous discharge lamp having a sealed, radiation-transparent envelope defining an elongate plasma-containing cavity of capillary cross-section and arcuate configuration. The cavity contains a gaseous substance and potential coupling means are associated with the envelope to energize the lamp, exciting the gaseous substance to generate a radiation-emitting plasma. A rigid mounting base is fixedly secured to one end of the envelope, the base having a configuration which is geometrically unique with respect to a predetermined position and spatial orientation of said envelope whereby installation of the lamp in its operating environment automatically and reproducibly places the envelope and, concomitantly, the plasma cavity of the lamp, in a predetermined position and spatial orientation relative to said environment.

BRIEF DESCRIPTION OF THE DRAWING

FIG. 1 is a longitudinal sectional view, on an enlarged scale, of a gaseous discharge lamp in accordance with the instant invention.

FIG. 2 is a sectional view of a mounting fixture in accordance with the invention with the base portion of the FIG. 1 lamp mounted therein, the lamp base being shown in a slightly modified form.

FIG. 3 is a sectional view on line 3—3 of FIG. 2 looking in the direction of the arrows; and FIG. 4 is a fragmentary sectional view of the base portion of a gaseous discharge lamp exemplifying an alternative embodiment of the invention.

DESCRIPTION OF THE PREFERRED EMBODIMENT

Referring now to the drawings, there is illustrated in FIG. 1, for the purposes of example as previously stated, a mercury vapor lamp 10 of a particular arcuate configuration adapting it for use as the light source in an apparatus such as described in the aforementioned application Ser. No. 339,860 for photoresist exposure in the production of semiconductor devices. Lamp 10 comprises a tubular envelope 12 of glass or other radiation-transmitting material. The mid-section of envelope 12, which emits the major part of the useful illumination, is of an arcuate form. In the illustrated embodiment the arcuate mid-section of envelope 12 subtends an arc of 85° with a radius of about 0.55 inches. However, it will be understood that neither the length of the arcuate section nor the sharpness of the bend are critical except to the particular apparatus in which the lamp is employed.

The interior of envelope 12 is a bore or plasma cavity 14 of capillary dimensions, e.g., a diameter of 2 mm in the lamp being described.

At each end, envelope 12 terminates in respective solid cylindrical stubs 16, 18 of slightly smaller diameter than the main body of the envelope. Cavity 14 terminates short of the end stubs 16, 18 and at each end is provided with a respective electrode 20, 22. Electrode 20 is electrically connected by a conductor, now shown, to a highly flexible connection lead 24 mechanically secured to stub 16 at one end and carrying a connection fitting, such as a banana plug 26, at its free end. The flexibility and conductivity required in lead 24 is achieved in the illustrated embodiment by fabricating it of a tubular silver braid.

Of course, where R-F energization is employed, electrodes 20, 22 would be omitted and other potential-coupling means provided in accordance with known techniques of the electrodeless discharge lamp art.

In this connection reference may be had to copending application Ser. No. 441,600 filed Feb. 11, 1974 as a continuation of abandoned application Ser. No. 337,060 of Fred C. Gabriel and J. W. Vollmer filed Mar. 1, 1973 and assigned to the same assignee as the present invention; to Meggers and Oliver, "Lamps and Wavelengths of Mercury 198" (Research Paper RP 2091) in the Journal of Research of the National Bureau of Standards, Vol. 44, May, 1950; and/or to R. G. Brewer, "High Intensity Low Noise Rubidium Light Source," The Review of Scientific Instruments, vol. 32, No. 12 (Dec., 1961), pp. 1356–1358.

The opposite end stub 18 of envelope 12 is provided with a rigid mounting base 28 having a configuration which is geometrically unique with respect to the position and spatial orientation of the envelope. In the illustrated embodiment base 28 takes the form of a right-angular regular hexagonal prism containing a concentric axial bore 30 closed at one end by a flat surface 32 perpendicular to the common axes of the hexagonal prism and the internal bore. The diameter and length of the bore 30 are such as to receive end stub 18 with sufficient clearance to enable longitudinal, lateral and angular positional adjustment of the stub relative to the base. Thus, during assembly of the envelope to the base, the spatial relation and orientation of these two members can be precisely established as by use of a suitable jig or fixture and, when established, is maintained by securing the base to the envelope stub with solder 34 or by other suitable means.

In the electrode-energized form of the lamp illustrated and described, lamp base 28 is fabricated of copper, brass or other electrically-conductive material and is electrically connected to electrode 22. Where R-F energization is used, base 28 might preferably be formed of an electrically non-conductive material.

The operation of lamp 10 is wholly conventional; when energized by application of a suitable high voltage on electrodes 20, 22 mercury vapor conducts current between the electrodes forming a luminous plasma conforming to the shape of capillary cavity 14.

As will become apparent in the ensuing description, the configuration of the base and its known and fixed relationship to the envelope enables the installation of the lamp with the plasma occupying a precisely established position, which position is reproducible when it is necessary to install a new lamp.

Referring to FIGS. 2 and 3, there is illustrated a mounting block 36 which constitutes a fixed member on, or portion of, the apparatus employing lamp 10. The lamp in FIGS. 2 and 3 has a base 28' which is a modification of that shown in FIG. 1. Instead of being a complete hexagonal prism, base 28 has a cylindrical exterior except for enlarged end portions 29, 31 which are hexagonal in cross section. It will be appreciated that the specific forms of lamp bases 28 and 28' are interchangeable insofar as to mounting block 36 is concerned. Block 36 carries locating faces which accommodate the lamp base and secure it in a manner which precisely locates the envelope and, of particular importance, the luminous plasma of the operating lamp. To this end, for a lamp with either a complete or partial hexagonal configuration, block 36 has a pair of planar locating faces 38, 40 intersecting at an angle of 60°, i.e., one-half the angle between the faces of a regular hexagon, so that faces 38, 40 are complementary to and mate with two non-adjacent non-parallel faces 42, 44 of the hexagonal ends of base 28'. A clamp assembly 46, to be described presently, engages a third nonadjacent non-parallel face non-adjacent, of base 28' thus maintaining the base against rotational and lateral translational displacement. A locating stop member 50 in abutment with the end face 32 of mounting base 28' establishes the axial position of the base.

Clamp assembly 46 consists of clamping plate 52 having one edge disposed on an elongated rib 54 on block 36 which extends parallel to the intersection of faces 38, 40. Rib 54 extends above the surface of block 36 by an amount at least approximately equal to that which the hexagonal portions of lamp mounting base 28' extend above the same surface when faces 42 and 44 are in abutment with faces 38 and 40, respectively. Under these conditions, the edge of plate 52 remote from rib 54 extends over and parallel to the lamp base axis and makes surface contact with faces 48 of the base 28'. A machine screw 56 extending through an aperture (not shown) in clamping plate 52 is threaded into block 36. The head 58 of machine screw, enlarged and preferably knurled to facilitate manual insertion and removal, bears on the upper surface of plate 52 so that tightening of the screw clamps lamp base 28' in the preset position. A coil spring 60 is disposed around the shank of screw 56 and compressed between block 36 and the underside of plate 52.

From the foregoing description it will be seen that a lamp may be installed with its plasma-containing region in a precise position relative to block 36, and therefore the apparatus comprising block 36, by simply inserting the lamp with the appropriate faces of its base in abutment with faces 38 and 40 and its end surface 32 against stop 50 and tightening screw 56. In this connection, it should be noted that gross positioning is obviously performed by the operator.

Electrical connection to the electrode adjacent the lamp mounting base is effected by lamp installation. The circuit is completed by connection of flexible connection lead 24 (FIG. 1) to the power supply. The high flexibility of lead 24 insures that no stress such as would deflect or deform the lamp envelope is transmitted to the envelope.

In FIG. 4 there is illustrated an alternative construction of the lamp base designated 28" which has substantially the same external configuration as base 28'. However, the stub 18 of envelope 12 is positioned and secured within bore 30 by means of a plurality of set screws 62, 64, 66, 68, 70 and others not appearing in the drawing. Set screws 62, 64, 66 and 68 are threaded radially into hexagonal end portions 29' and 31' in diametrically opposed pairs; a similar set of four screws, not shown, is provided in a plane perpendicular to the set appearing in FIG. 4. These two sets of screws permit lateral adjustment of the position of stub 18 and screw 70 enables its axial adjustment. By selectively turning the screws a precise location of stub 18 and, therefore, the lamp plasma can be achieved and maintained relative to the lamp base.

FIG. 4 also illustrates an alternative mode of clamping the lamp base in the mounting block, viz., a modified clamping plate 52' is provided, dimensioned and positioned to bear on the cylindrical mid-portion of base 28" intermediate hexagonal ends 29',31'.

What is claimed is:

1. A gaseous discharge lamp comprising:

a. a radiation-transmitting tubular envelope defining a plasma cavity of arcuate configuration and capillary cross-section containing an ionizable substance;

b. a rigid mounting base fixedly secured to one end of said envelope having a configuration which is geometrically unique with respect to a predetermined position and spatial orientation of said envelope, *said base having a coaxial bore and said one end of said envelope terminating in a cylindrical stub of significantly smaller axial and radial dimensions than said bore, said stub being disposed and mounted in said bore in a position such as to establish a predetermined spatial relation and orientation between the envelope and the base,* whereby installation of the lamp in its operating environment automatically and reproducibly places the envelope and, concomitantly, the plasma cavity of the lamp in a predetermined position and spatial orientation relative to said environment; and c. means for coupling the lamp to a power source for applying an operating potential to said plasma cavity.

2. A gaseous discharge lamp according to claim 1, wherein at least a portion of the external surface of said mounting base is non-circular in cross-section.

3. A gaseous discharge lamp according to claim [2] *1* wherein the external surface of said mounting base takes the form of a hexagonal prism.

4. A gaseous discharge lamp according to claim 3 wherein [said base contains a co-axial bore and said one end of the envelope terminates in a cylindrical stub of significantly smaller axial and radial dimensions than said bore,] said stub [being] *is* disposed and secured in said bore in a position such as to establish a predetermined spatial relation and orientation between the envelope and the prism faces of said base.

5. A gaseous discharge lamp according to claim [4] *3* wherein said mounting base is electically conductive and said coupling means include:

a. an electrode adjacent each end of said cavity, the electrode proximate the mounting base being electrically connected thereto; and b. a highly flexible connection lead on the envelope electrically connected to the electrode remote from the mounting base.

6. In combination, a gaseous discharge lamp according to claim 5 and a mounting fixture therefor comprising:

a. a mounting block having locating faces complementary to and in mating relationship with selected ones of said planar faces of the mounting base;

b. a locating stop abutting the end of said mounting base remote from the envelope; and c. a removable clamping assembly maintaining the planar faces of the mounting base pressed firmly against the locating faces of the mounting fixture.

7. In combination, a gaseous discharge lamp according to claim 1 and a mounting fixture [therefore] *therefor* comprising:

a. a mounting block having a configuration complementary to and adapted to receive said mounting base in a fixed position defined by its co-action with the configuration of said mounting base; and b. means releasably retaining said mounting base in said mounting block.

* * * * *